United States Patent [19]

Sorden

[11] 4,150,432
[45] Apr. 17, 1979

[54] FREQUENCY COUNTER AND METHOD
[75] Inventor: James L. Sorden, Saratoga, Calif.
[73] Assignee: Hewlett-Packard Company, Palo Alto, Calif.
[21] Appl. No.: 861,805
[22] Filed: Dec. 19, 1977
[51] Int. Cl.² .................... G01R 23/02; G06F 15/20
[52] U.S. Cl. ............................ 364/484; 324/78 D; 324/79 D; 364/701
[58] Field of Search ................ 364/484, 551, 701; 324/78 R, 78 D, 78 Z, 79 D, 186; 328/140, 141

[56] References Cited
U.S. PATENT DOCUMENTS

| | | | |
|---|---|---|---|
| 3,304,504 | 2/1967 | Horlander | 364/484 X |
| 3,555,256 | 1/1971 | Westlake | 364/701 |
| 3,609,326 | 9/1971 | Bagley et al. | 364/551 |
| 3,631,343 | 12/1971 | Schmidhauser | 324/186 |
| 4,073,432 | 2/1978 | Schröder | 324/78 D X |

Primary Examiner—Jerry Smith
Attorney, Agent, or Firm—Michael L. Sherrard

[57] ABSTRACT

An averaging frequency counter for determining the frequency of recurrence of input signals has an event counter for counting a number of the input signals, a gate counter for counting a number of time intervals during which the input signals are counted, and a time interval measurement circuit for measuring the cumulative duration of the time intervals. A systematic error associated with the measurement of the duration of each time interval is determined during an application of a calibrated frequency to the averaging frequency counter by dividing a calculated total time error by the number of time intervals. The systematic error is subsequently used to correct a measurement of an unknown frequency during an application of the unknown frequency to the averaging frequency counter by subtracting a product of the number of the time intervals and the systematic error from the cumulative duration.

6 Claims, 4 Drawing Figures

FREQUENCY COUNTER AND METHOD

BACKGROUND

Typical averaging frequency counters are described in U.S. Pat. No. 3,609,326 entitled "Counting Apparatus and Method Using Separate Counters for Reference and Unknown Signal", issued to Alan S. Bagley and France Rode on Sept. 28, 1971, and by James L. Sorden in "A New Generation in Frequency and Time Measurements", Hewlett-Packard Journal, June 1974. In these counters a number of signals recurring at an unknown frequency are gated to an event counter for a number of time intervals. A cumulative time interval measurement circuit is activated synchronously with the event counter to measure a cumulative duration of the number of time intervals comprising a desired measurement. The number of events counted by the event counter divided by the cumulative duration of the time intervals represents the value of the unknown frequency. However, a systematic error is associated with the measurement of each time interval due to mismatches in the start and stop functions of the cumulative time interval measurement circuit. For reciprocal frequency measurement techniques using short time intervals this error causes especially undesirable errors in the determination of the unknown frequency.

SUMMARY

An averaging frequency counter determines a frequency of recurrence of input signals by dividing a number of input signals by a cumulative duration of a number of time-related time intervals counted by an interval counter means. Calibration means selectively apply input signals recurring at a known frequency to the averaging frequency counter and determine a systematic error associated with a time measurement of a duration of a time interval. The systematic error is used to correct the measurement of the cumulative duration of a number of time intervals during a selective application of input signals recurring at an unknown frequency to the averaging frequency counter.

DETAILED DESCRIPTION OF THE PREFERRED EMBODIMENT

Figure 1:
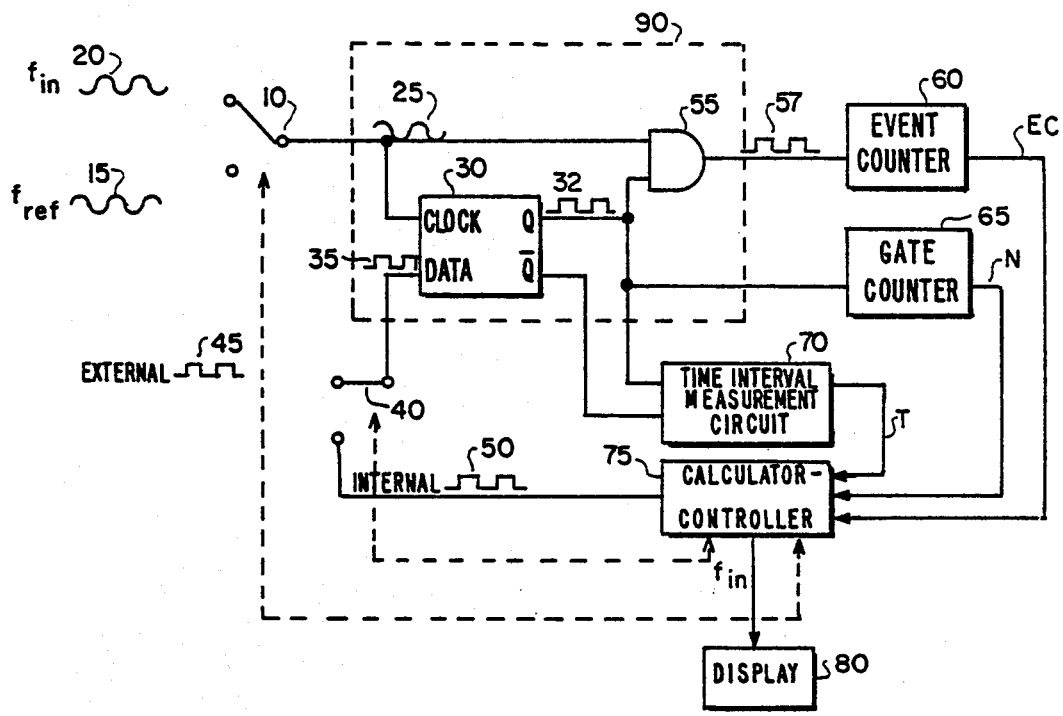
FIG. 1 is a block diagram of the preferred embodiment of the present invention.

A block diagram of the preferred embodiment of the present invention is illustrated in FIG. 1. A switch 10 selects either a frequency signal 15 or an input signal 20, and applies the selected signal 25 to a clock input of a flip-flop 30. A data input of the flip-flop 30 is coupled to receive a selected arming signal 35 which is selected by a switch 40 from either an external arming signal 45 or an internal arming signal 50. The selected signal 25 and a gate signal 32 from a Q output of the flip-flop 30 are applied to first and second inputs of AND gate 55 respectively. AND gate 55 generates pulses 57 in response to the signals applied to the inputs thereof.

Figure 2:
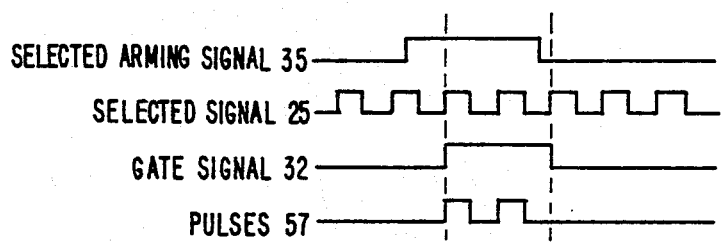
FIG. 2 is an illustration of the operating waveforms of the synchronizer circuit 90.

The operating waveforms of a synchronizer circuit 90 comprising the flip-flop 30 and the AND gate 55 are shown in FIG. 2. Flip-flop 30 is armed by application of the selected arming signal 35 to the data input thereof. While armed, the flip-flop 30 produces the gate signal 32 on the Q output in response to a next occurring leading edge of a pulse of the selected signal 25. Similarly, after the selected arming signal 35 from the data input is removed, the gate signal 32 on the Q output is terminated in response to a next occurring leading edge of a pulse of selected signal 25. In this way the pulses 57 generated by AND gate 55 are all integral clock pulses and the gate signal 32 is synchronized with the integral clock pulses. The synchronizer circuit 90 thus avoids a bias in a measurement of a duration of a gate signal 32 caused by truncating clock pulses. Synchronizer circuits of this type and their operating characteristics are described by David C. Chu in "Time Interval Averaging: Theory, Problems, and Solutions", Hewlett-Packard Journal, June 1974. Synchronizing circuits of this type are also discussed in U.S. Pat. No. 3,631,343 entitld "Time Interval Averaging Circuit" issued to Rolf Schmidhauser on Dec. 28, 1971.

An event counter 60, illustrated in FIG. 1, is coupled to AND gate 55 for counting a number EC of the pulses 57. A gate counter 65 is coupled to the Q output of the flip-flop 30 to receive the gate signal 32 for counting a number N of gate signals 32. A time interval measurement circuit 70 is coupled to the Q and $\bar{Q}$ outputs of the flip-flop 30 for measuring a cumulative time T during which the gate signal 32 is present. Suitable time interval measurement circuits operational in this embodiment are described in the referenced article by James L. Sorden and in an article entitled "Ovenless Oscillators will Resolve 20-Picoseconds Pulses" in Nov. 10, 1977, Electronics by David C. Chu and Keith M. Ferguson.

A calculator-controller 75 is coupled to the event counter 60, the gate counter 65 and the time interval measurement circuit 70 for receiving the counts EC and N, and the cumulative time T. The calculator-controller 75 is further coupled to the switches 10 and 40 for controlling operation as described in detail below.

To calculate a systematic error $\Delta T$ associated with the measurement of the time duration of each gate signal 32, calculator-controller 75 causes switch 10 to select the frequency reference signal 15 and to apply the selected signal 25 to the flip-flop 30 and to the AND gate 55. After a measurement is completed, as determined by elapse of a preselected time, the calculator-controller 75 receives the counts EC and N and the time T from the event counter 60, the gate counter 65 and the time interval measurement circuit 70 respectively. Since the frequency $f_{REF}$ of the frequency reference signal 20 is known, the systematic error $\Delta T$ associated with a measurement of a duration of each gate signal 32 equals the difference between the time T and the quotient of the count EC divided by the frequency $f_{REF}$, divided by the count N. In formula:

$$\Delta T = T - EC/f_{REF}/N$$

A measurement of a frequency $f_{IN}$ of the input signal 20 is subsequently achieved by calculator-controller 75 causing switch 10 to select the input signal 20 and apply the selected signal 25 to the flip-flop 30 and the AND gate 55. The frequency of the input signal 20, $f_{IN}$, is then calculated by dividing the count EC by the difference between the time T and the product of the count N and the systematic error ΔT. In formula:

$$f_{IN} = EC/T - (N \cdot \Delta T)$$

Figure 3:
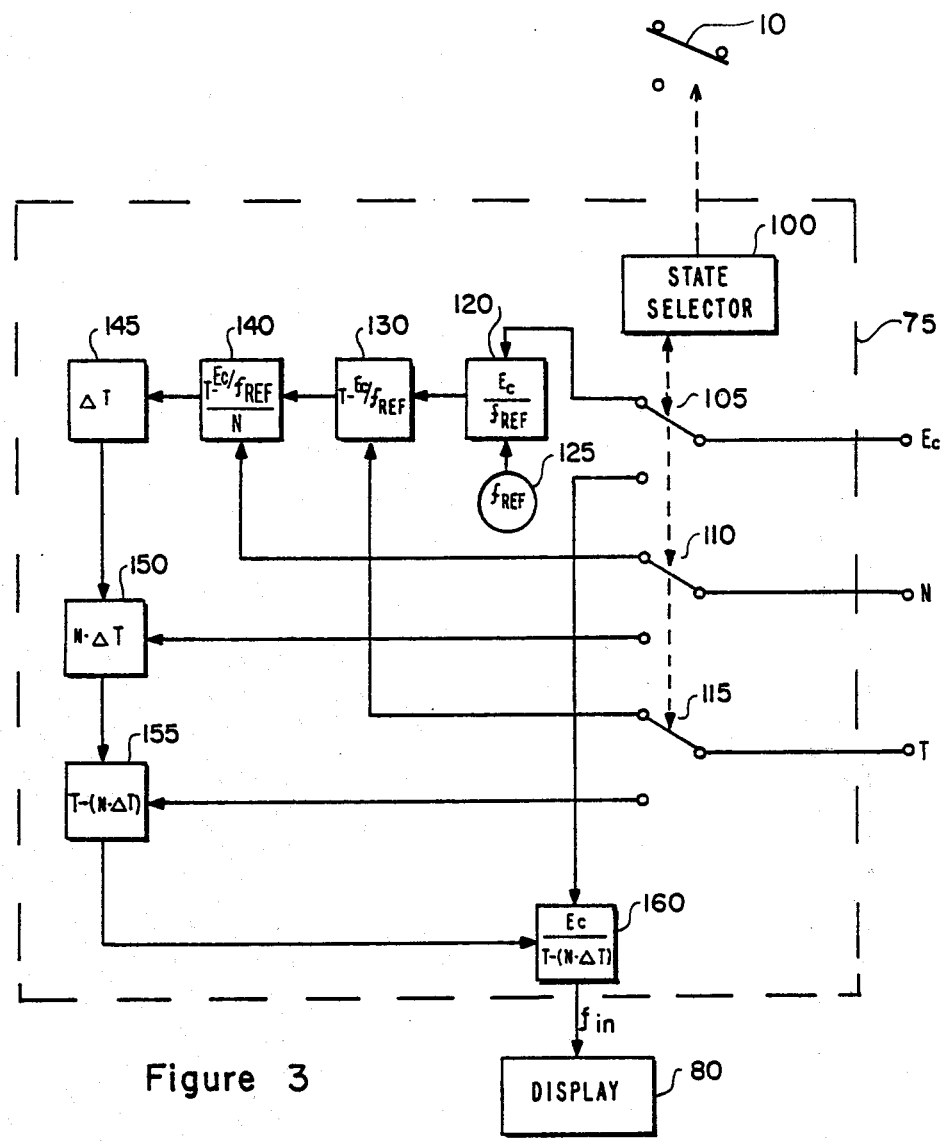
FIG. 3 is an illustration of one embodiment of the calculator-controller 75.
Figure 4:
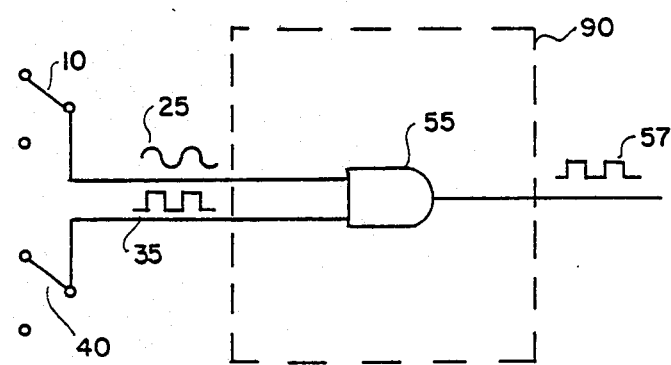
FIG. 4 is a block diagram of a direct gating circuit which is an alternative for the synchronizer circuit 90.

One embodiment of the calculator-controller 75 is illustrated in FIG. 3. A state selector 100 selects one of a first and second operating states corresponding to the calculation of the systematic error ΔT and the measurement of the frequency $f_{IN}$ respectively. In the first operating state the state selector 100 causes switches 105, 110 and 115 to couple counts EC and N and the time T to dividers 120 and 140 and a subtractor 130 respectively, in timed relationship with the selection of the frequency reference signal 15 by the switch 10. A value of the frequency $f_{REF}$ stored in a memory 25 is applied to the divider 120 for dividing the count EC by the frequency $f_{REF}$. The resulting quotient is subtracted from the time T in the subtractor 130 to produce a difference signal which is divided by count N in the divider 140 to produce a quotient signal. The quotient signal from the divider 140 is applied to and stored in a memory 145 and represents the systematic error ΔT.

The state selector 100 subsequently selects the second operating state and causes the switches 105, 110 and 115 to couple counts EC and N and time T to a divider 160, a multiplier 150, and a subtractor 155 respectively in timed relationship with the selection of the input signal 20 by the switch 10. The count N is multiplied by the systematic error ΔT in the multiplier 150 to produce a product which is subtracted from the time T by the subtractor 155 to produce a difference signal. The count EC is divided by the difference signal from subtractor 155 to produce a display signal representative of the input frequency $f_{IN}$ by a divider 160. The display signal is coupled to a display 80 to provide a visual indication of a magnitude of the input frequency $f_{IN}$.

In an alternative embodiment the calculator-controller 75 is replaced by a microprocesser under the control of a software program designed to implement the equivalent logic operations.

The present invention may comprise the implementation of the gate counter 65 as software in the calculator-controller 75. In this alternative embodiment, switch 40 selects the internal gate signal 50 generated by the calculator-controller 75. A number of internal gate signals 50 are generated and used in the computations of the systematic error ΔT and input frequency $f_{IN}$. Further, a measurement can be terminated upon the generation of the preselected number of the gate signals 50 rather than upon the elapse of a preselected time. However, this technique is not preferred for counting a high-speed pulsed RF signal such as commonly used in short range radar because of the comparatively lower speed of a software counter.

In place of a synchronizer circuit 90, a typical synchronizer circuit or direct gating circuit such as the circuits described on page 8 of the Hewlett-Packard Application Note 162-1 could be substituted. However, the use of the synchronizer circuit 90, or of an equivalent circuit as described in the aforementioned patent issued to Rolf Schmidhauser, is preferred because such a synchronizer circuit avoids the biasing errors otherwise present.

I claim:
1. Electronic apparatus comprising:
calibration means for providing first signals recurring at a known frequency;
input means for providing second signals recurring at an unknown frequency;
selection means having an output, a first input coupled to said calibration means and a second input coupled to said input means for providing selected signals on the output representative of a selected one of the first and second signals;
arming means for providing gate signals each having an initiating and a terminating event;
gate means having an output, a first input coupled to said selection means and a second input coupled to said arming means for producing output signals on the output which are representative of the selected signals occurring during time intervals initiated and terminated by the initiating and terminating events, respectively;
event counter means coupled to said gate means for providing first and second counts of output signals applied thereto during the selection of first and second signals, respectively;
time measurement means coupled to said arming means for generating first and second time signals representative of a cumulative time between initiating and terminating events during the selection of the first and second signals, respectively;
signal means for producing first and second gate count signals representative, respectively, of a first and second number of gate signals provided by said arming means during the selection of the first and second signals, respectively; and
output means coupled to said selection means, said event counter means, said time measurement means and said signal means for calculating a systematic error associated with the measurement of the time between each initiating and terminating event in response to the first time signal, the first count, the known frequency and the first gate count signal and producing an output representative of the unknown frequency in response to the second count, the second time signal, the second gate count signal and the systematic error.

2. Electronic apparatus as in claim 1 wherein said signal means is coupled to said arming means and further comprises means for counting the first and second number of the gate signals and producing first and second gate count signals representative of the first and second numbers.

3. Electronic apparatus as in claim 1 wherein said arming means is coupled to said selection means and further comprises means for providing the first and second number of gate signals during the selection of the first and second signals respectively.

4. Electronic apparatus as in claim 2 wherein said arming means is coupled to said selection means and further comprises means for synchronizing the gate signals with the selected signals.

5. Electronic apparatus as in claim 3 wherein said arming means is coupled to said selection means and further comprises means for synchronizing the gate signals with the selected signals.

6. A method comprising:
providing a first signal having first events recurring at a first frequency;
counting the first events during a first number of time intervals;
counting the first number of time intervals;
measuring a first sum of durations of the first number of time intervals;

determining a systematic error associated with the measurement of a time interval;

providing a second signal having second events recurring at a second frequency;

counting the second events during a second number of time intervals;

counting the second number of time intervals;

measuring a second sum of durations of the second number of time intervals;

subtracting the product of the systematic error and the second number from the second sum to produce a difference; and dividing the count of the second event by the difference to determine the second frequency.

* * * * *

UNITED STATES PATENT AND TRADEMARK OFFICE
CERTIFICATE OF CORRECTION

PATENT NO. : 4,150,432
DATED : April 17, 1979
INVENTOR(S) : James L. Sorden

It is certified that error appears in the above-identified patent and that said Letters Patent are hereby corrected as shown below:

Column 2, lines 61 and 62, cancel "$\Delta T = T-EC/f_{REF}/N$" and substitute -- $\Delta T = (T-EC/f_{REF})/N$;

Column 3, lines 3 and 4, cancel "$f_{IN} = EC/T-(N \cdot \Delta T)$" and substitute -- $f_{IN} = EC/[T-(N \cdot \Delta T)]$;

Column 3, line 16, cancel "25" and substitute -- 125 --;

Column 6, line 6, cancel "event" and substitute -- events --.

*Signed and Sealed this*

*Twenty-ninth* Day of *January 1980*

[SEAL]

Attest:

SIDNEY A. DIAMOND

*Attesting Officer*   *Commissioner of Patents and Trademarks*